(12) United States Patent
Elenitoba-Johnson et al.

(10) Patent No.: US 12,476,167 B2
(45) Date of Patent: Nov. 18, 2025

(54) SEMICONDUCTOR CHIP PACKAGE THERMO-MECHANICAL COOLING ASSEMBLY

(71) Applicant: Intel Corporation, Santa Clara, CA (US)

(72) Inventors: Olaotan Elenitoba-Johnson, Tigard, OR (US); Eric Erike, Mesa, AZ (US); Jeffory L. Smalley, Olympia, WA (US); Ulises Encarnacion, Tlaquepaque (MX); Ralph V. Miele, Hillsboro, OR (US); Phil Geng, Washougal, WA (US); Sri Priyanka Tunuguntla, Portland, OR (US); Shaun G. Immeker, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 729 days.

(21) Appl. No.: 17/696,694

(22) Filed: Mar. 16, 2022

(65) Prior Publication Data

US 2022/0208645 A1 Jun. 30, 2022

(51) Int. Cl.
*H01L 23/40* (2006.01)

(52) U.S. Cl.
CPC .. *H01L 23/4006* (2013.01); *H01L 2023/4087* (2013.01)

(58) Field of Classification Search
CPC .. H05K 7/1431; H05K 7/1489; H05K 7/2039; H05K 7/20409; H05K 7/20509; H05K 7/20709; H05K 7/20727; H05K 1/0203; H05K 1/0271; H05K 1/18; H05K 1/181; H05K 2201/066; H05K 2201/10598; H05K 2201/10734; H05K 2201/2009; H05K 2201/2018; H01L 23/053; H01L 23/32; H01L 23/367; H01L 23/3675; H01L 23/40; H01L 23/4006; H01L 23/4093; H01L 2023/405; H01L 2023/4081;

(Continued)

(56) References Cited

U.S. PATENT DOCUMENTS

| | | | | |
|---|---|---|---|---|
| 2004/0084764 | A1* | 5/2004 | Ishimine | H01L 23/4006 257/E23.084 |
| 2004/0246679 | A1* | 12/2004 | Cromwell | H05K 7/12 257/E23.084 |

(Continued)

*Primary Examiner* — Amir A Jalali
(74) *Attorney, Agent, or Firm* — Hanley, Flight & Zimmerman, LLC

(57) ABSTRACT

An apparatus is described. The apparatus includes a back plate. The apparatus includes a bolster plate that is secured to the back plate with a back bolt. The bolster plate has a window. The apparatus includes a circuit board between the back plate and the bolster plate. A semiconductor chip package is electro-mechanically coupled to the circuit board within the window. The apparatus includes a load stud that emanates from a face of the bolster plate. The back bolt emanates from an opposite face of the bolster plate. The load stud and back bolt are oriented along a same axis that is orthogonal to the face and the opposite face. The apparatus includes a heat sink. The apparatus includes a loading plate. The heat sink is mounted to the loading plate. The loading plate has a fixturing element that is secured to the load stud to secure the loading plate to the bolster plate.

18 Claims, 19 Drawing Sheets

(58) Field of Classification Search
CPC ............. H01L 2023/4087; H01L 21/56; H01L 21/4882; G06F 1/20
See application file for complete search history.

(56) References Cited

U.S. PATENT DOCUMENTS

| | | | |
|---|---|---|---|
| 2006/0087014 A1* | 4/2006 | Rubenstein | H01L 23/4006 |
| | | | 257/E23.084 |
| 2013/0083488 A1* | 4/2013 | Watanabe | H01L 23/4006 |
| | | | 257/E23.083 |
| 2015/0279761 A1* | 10/2015 | Bet-Shliemoun | H01L 23/42 |
| | | | 257/714 |
| 2017/0371384 A1* | 12/2017 | Ingalls | G06F 1/20 |
| 2019/0302857 A1* | 10/2019 | Buddrius | G06F 1/1658 |
| 2019/0393631 A1* | 12/2019 | Haswarey | G06F 1/20 |
| 2020/0101570 A1* | 4/2020 | Potter | G06F 1/203 |
| 2020/0411410 A1* | 12/2020 | Klein | H01L 23/427 |
| 2021/0183737 A1* | 6/2021 | Smalley | H01L 23/49551 |
| 2021/0410329 A1* | 12/2021 | Yang | H01L 23/3677 |

* cited by examiner

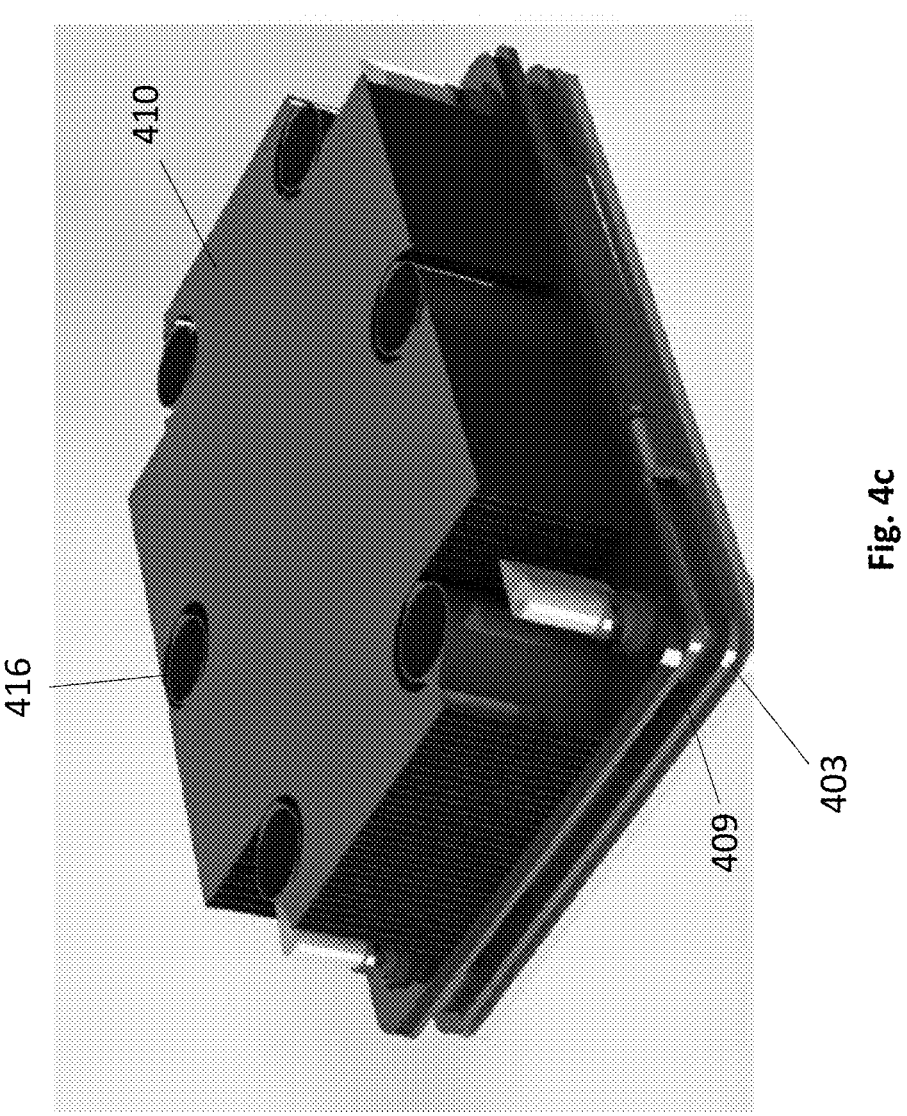

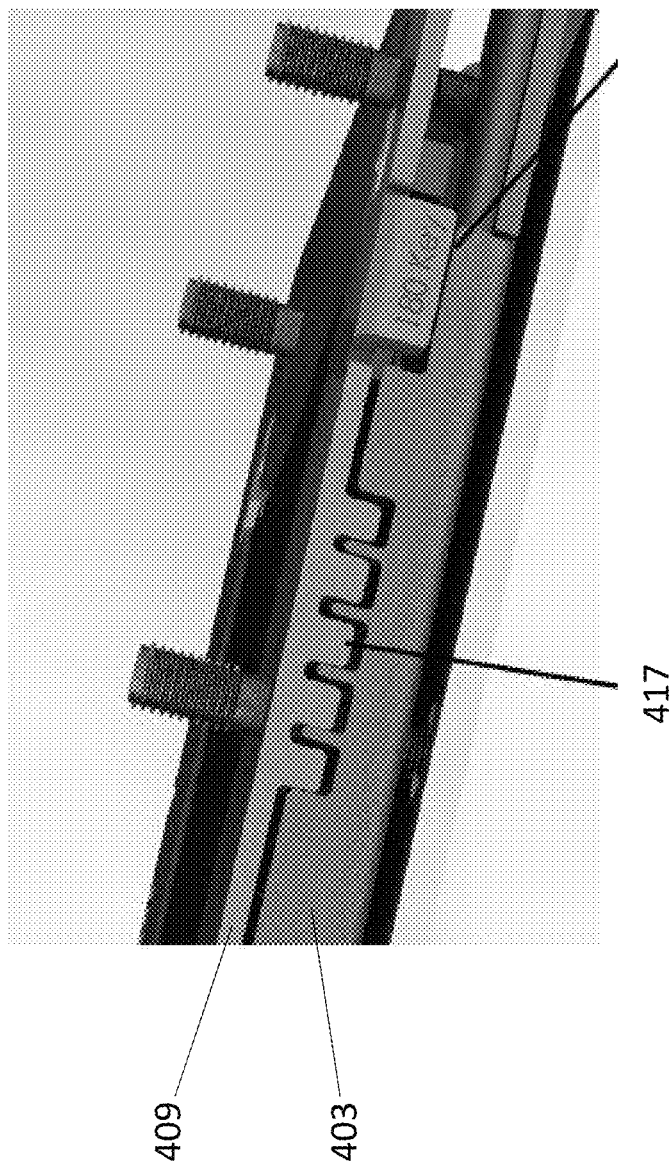

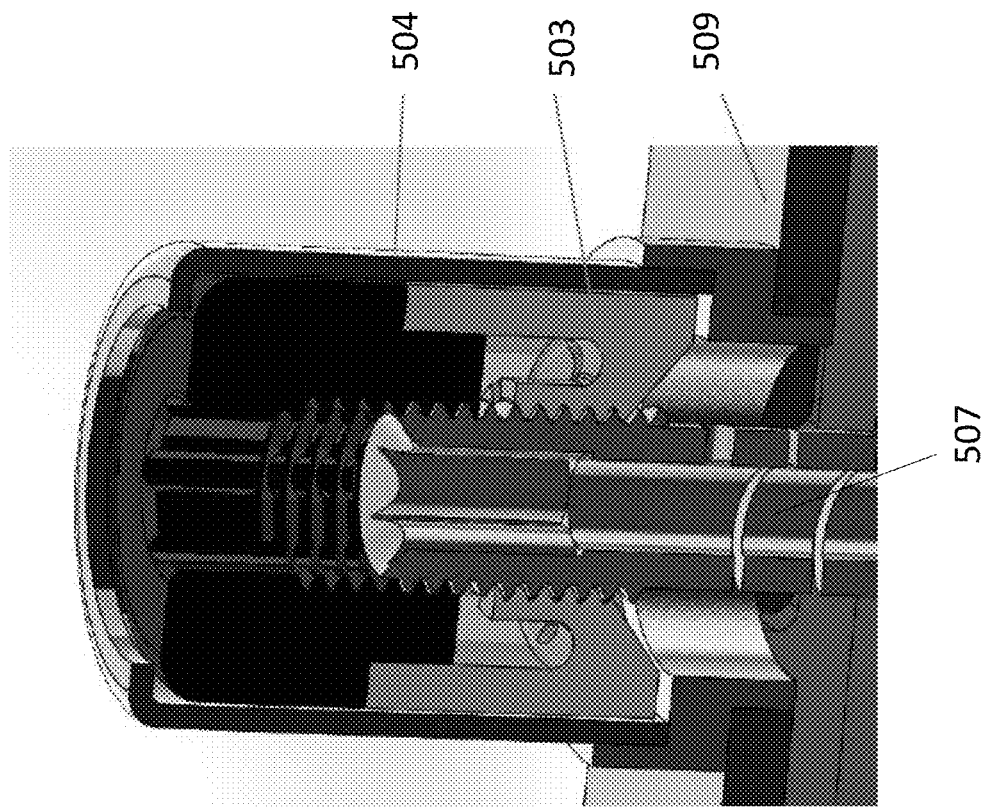

SEMICONDUCTOR CHIP PACKAGE THERMO-MECHANICAL COOLING ASSEMBLY

BACKGROUND

Thermal engineers face challenges, especially with respect to high performance data center computing, as both computers and networks continue to pack higher and higher levels of performance into smaller and smaller packages. Creative cooling solutions are therefore being designed to keep pace with the thermal requirements of such aggressively designed systems.

FIGURES

Figure 1A:
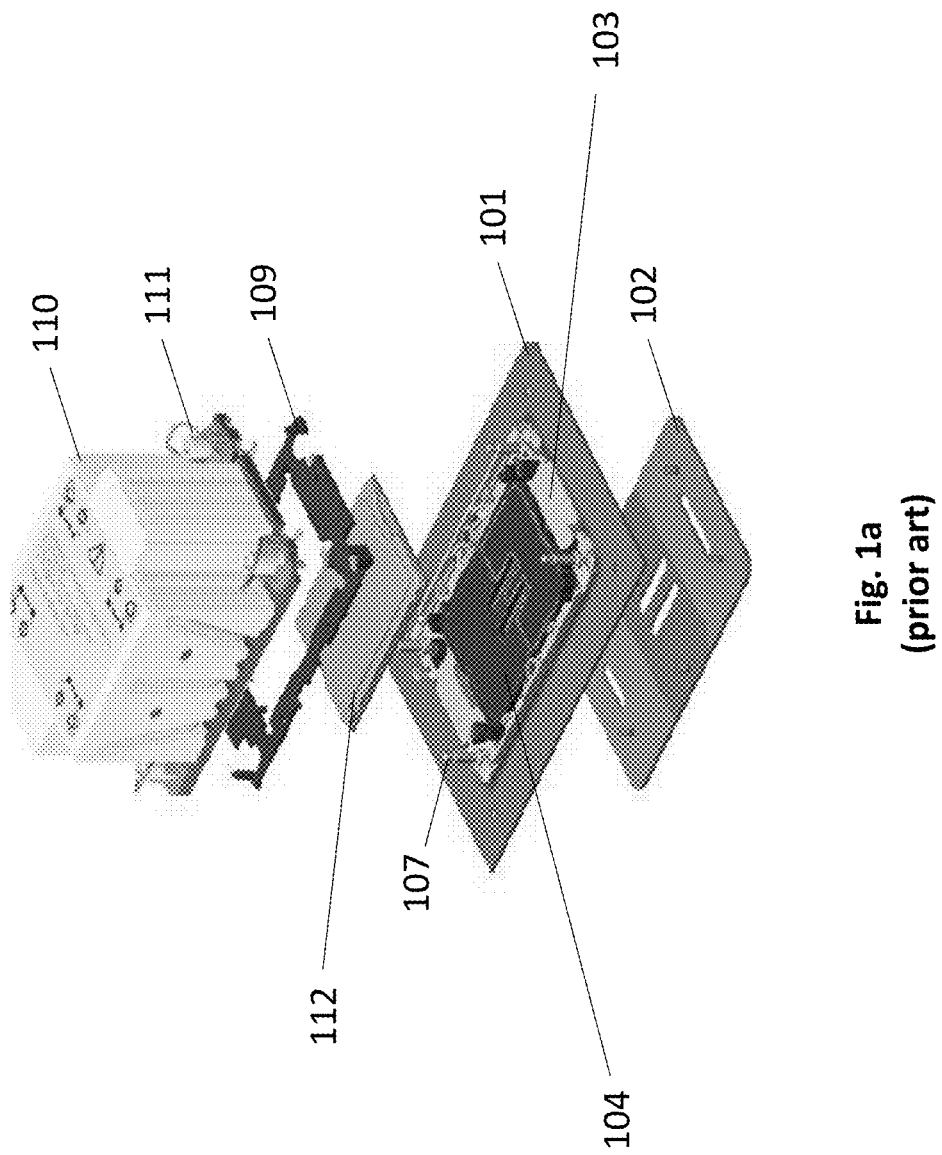
Figure 1B:
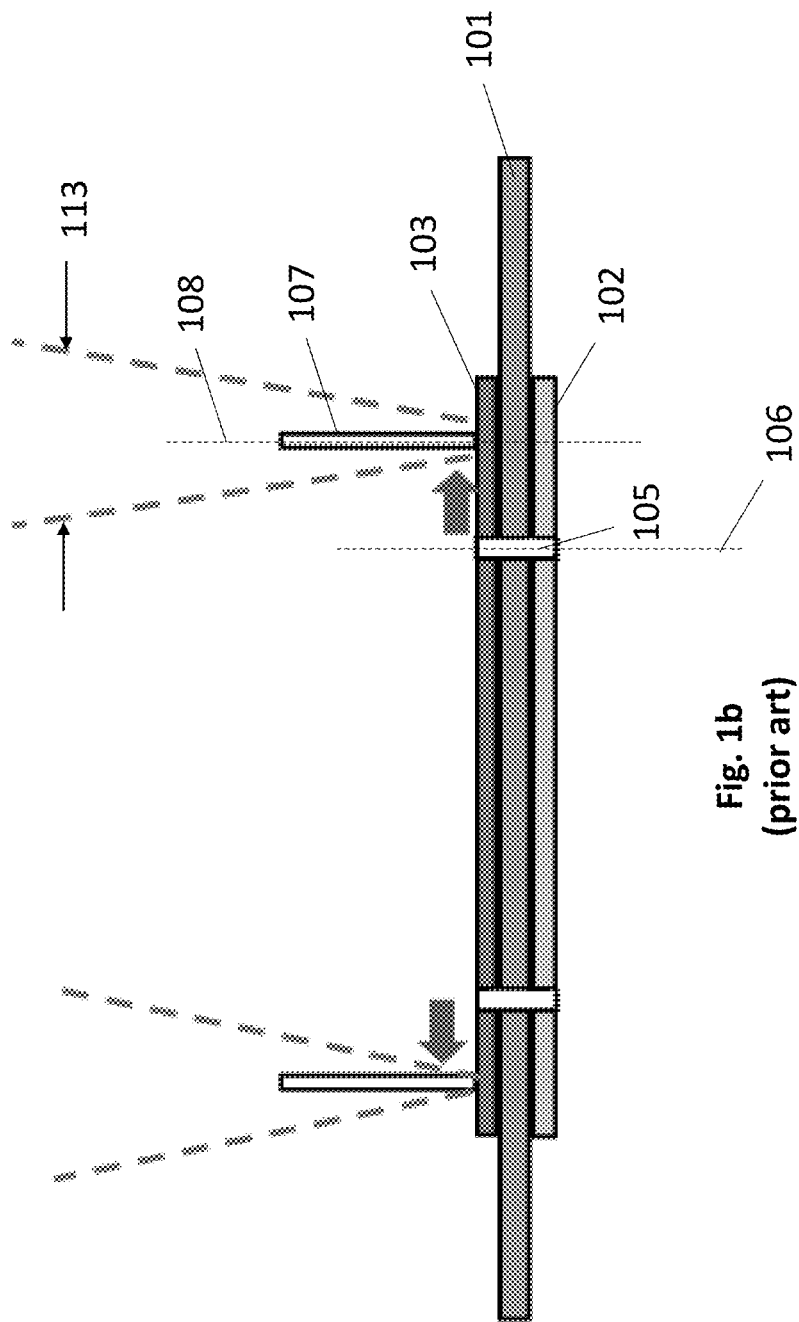
Figure 2A:
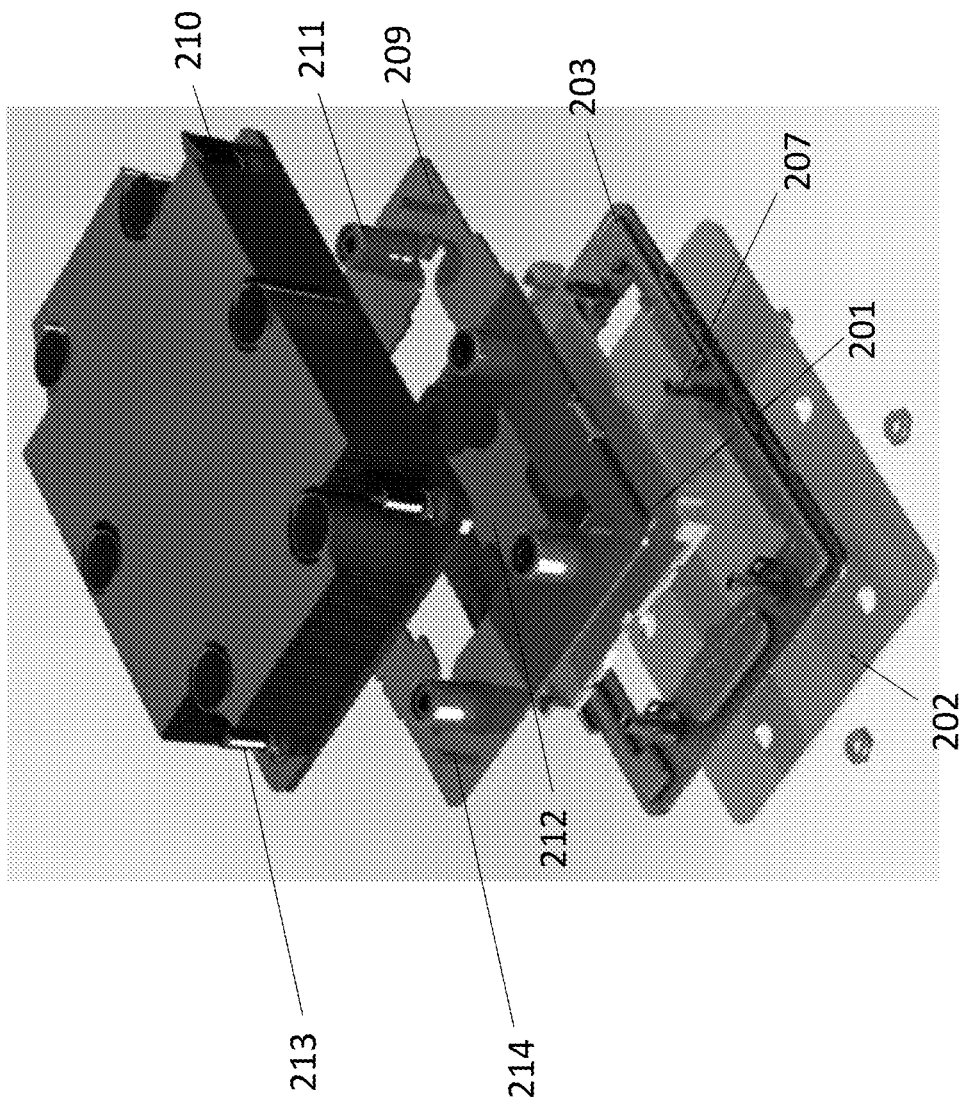
Figure 2B:
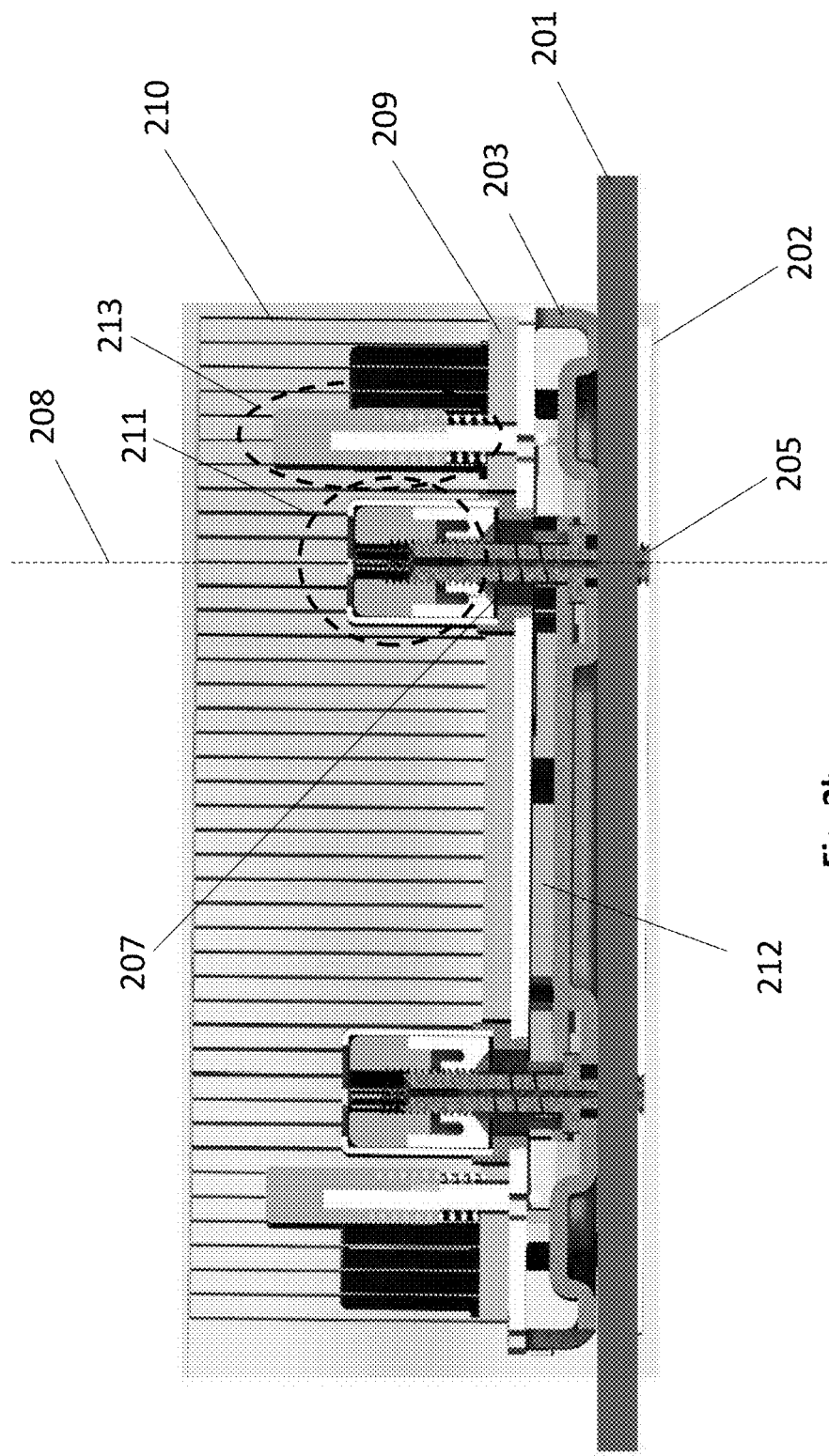
Figure 3A:
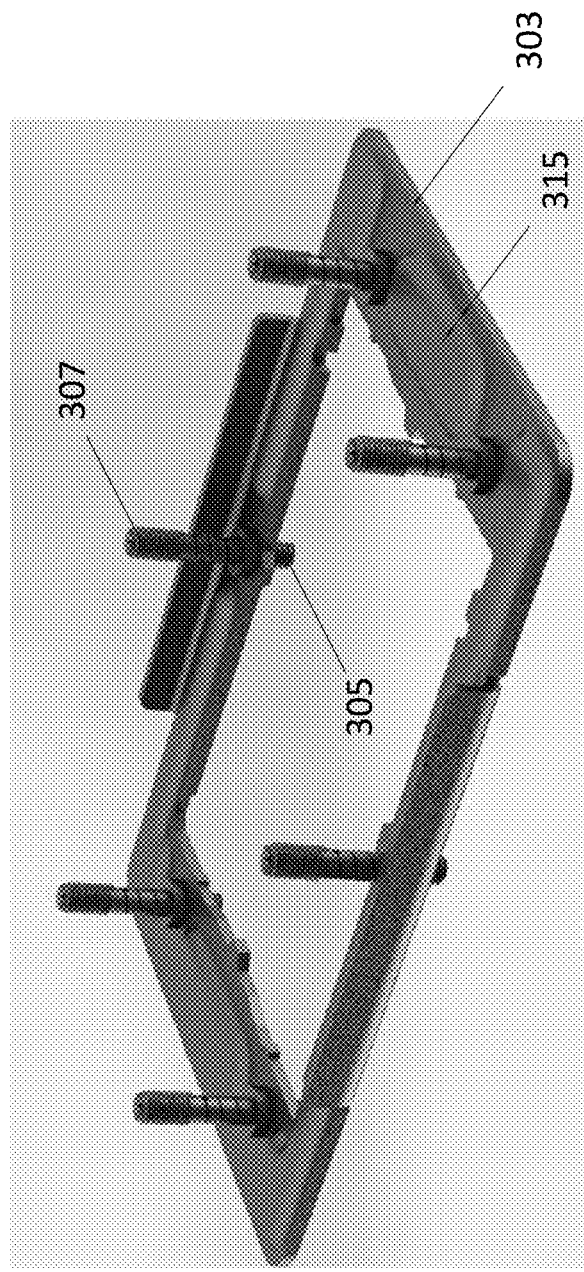
Figure 3B:
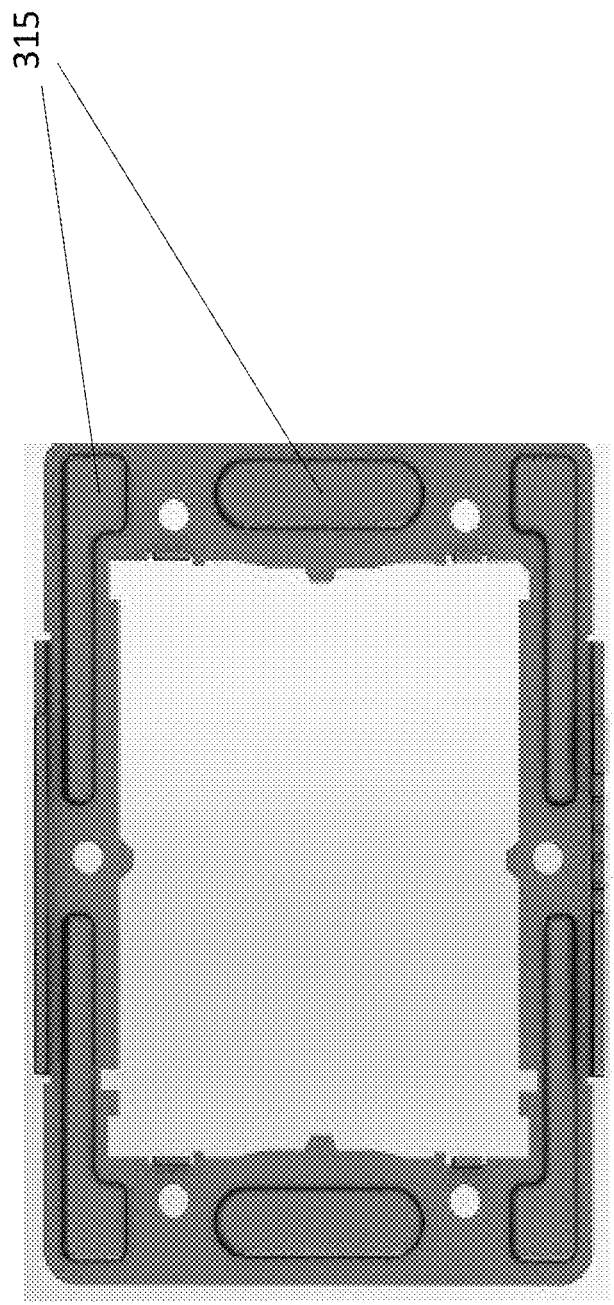
Figure 3C:
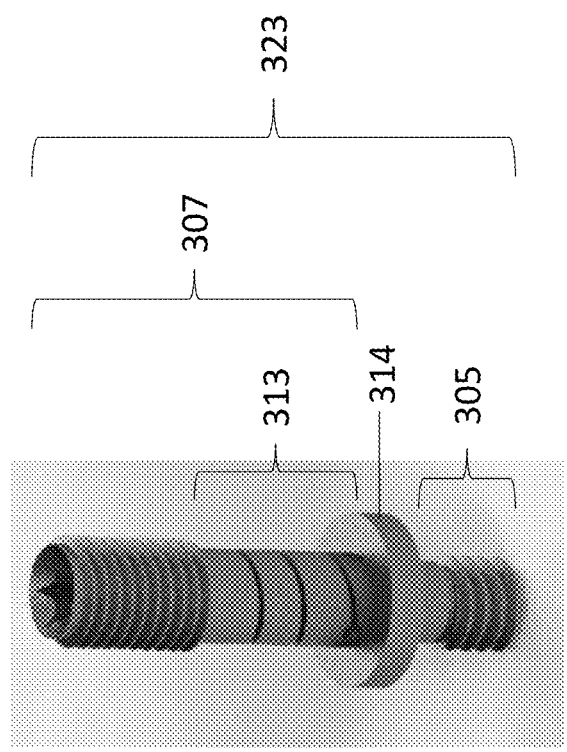
Figure 6:
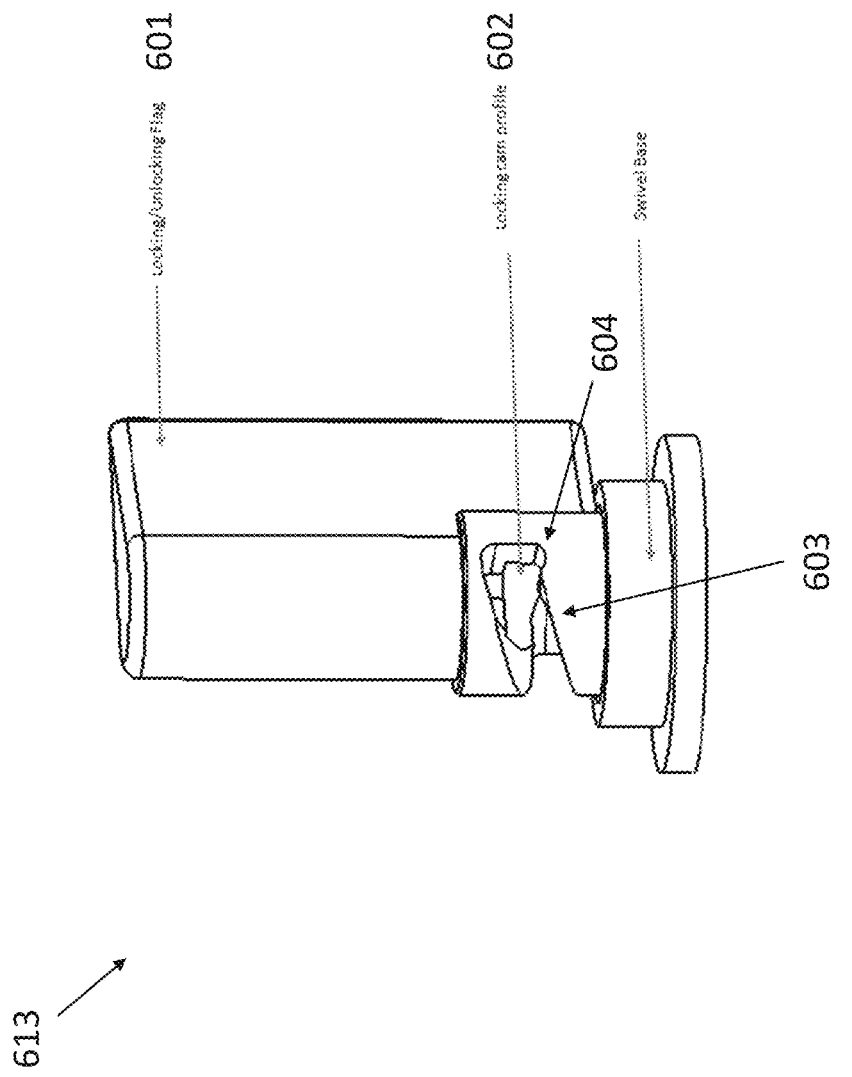
Figure 7:
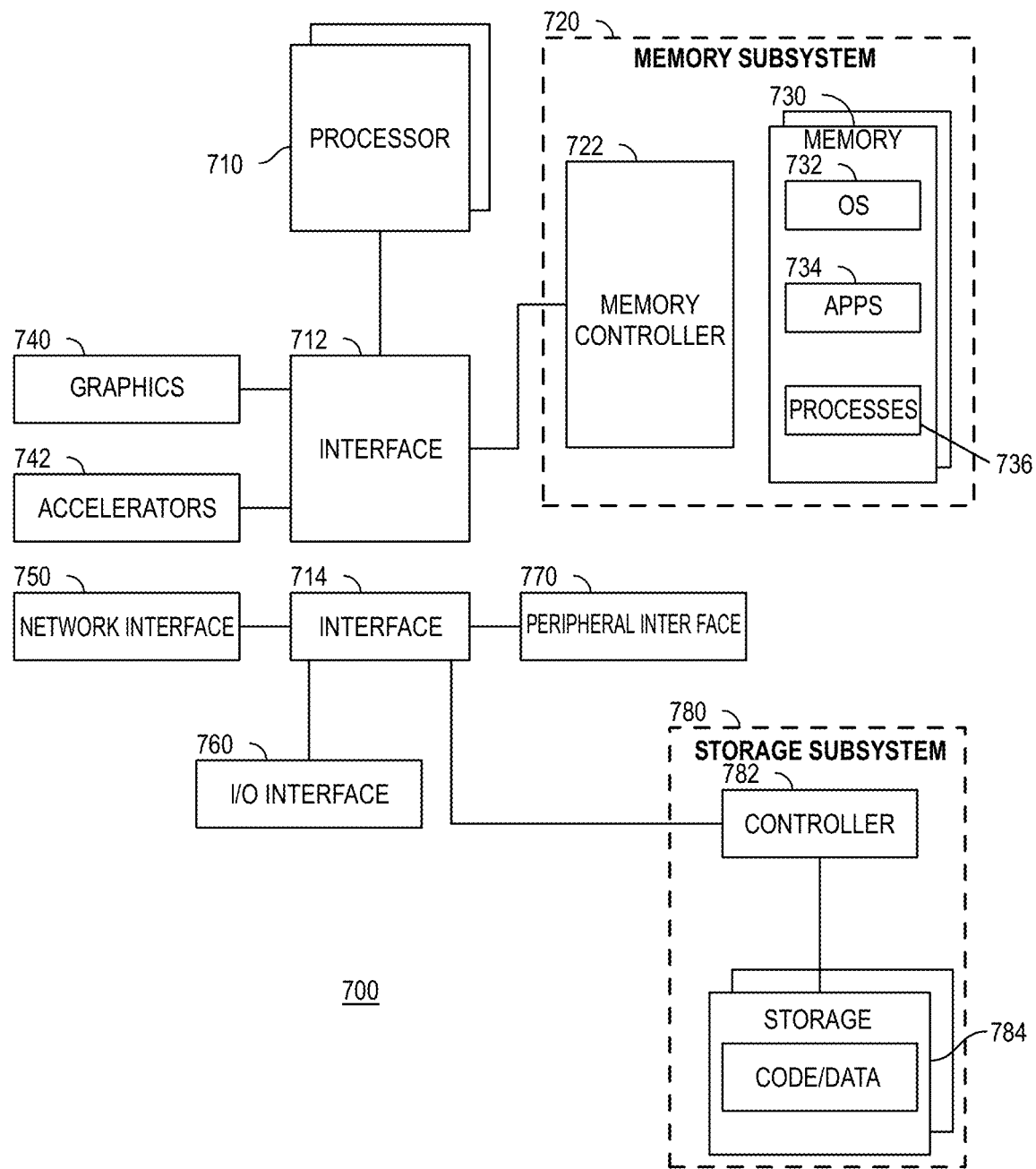
Figure 8:
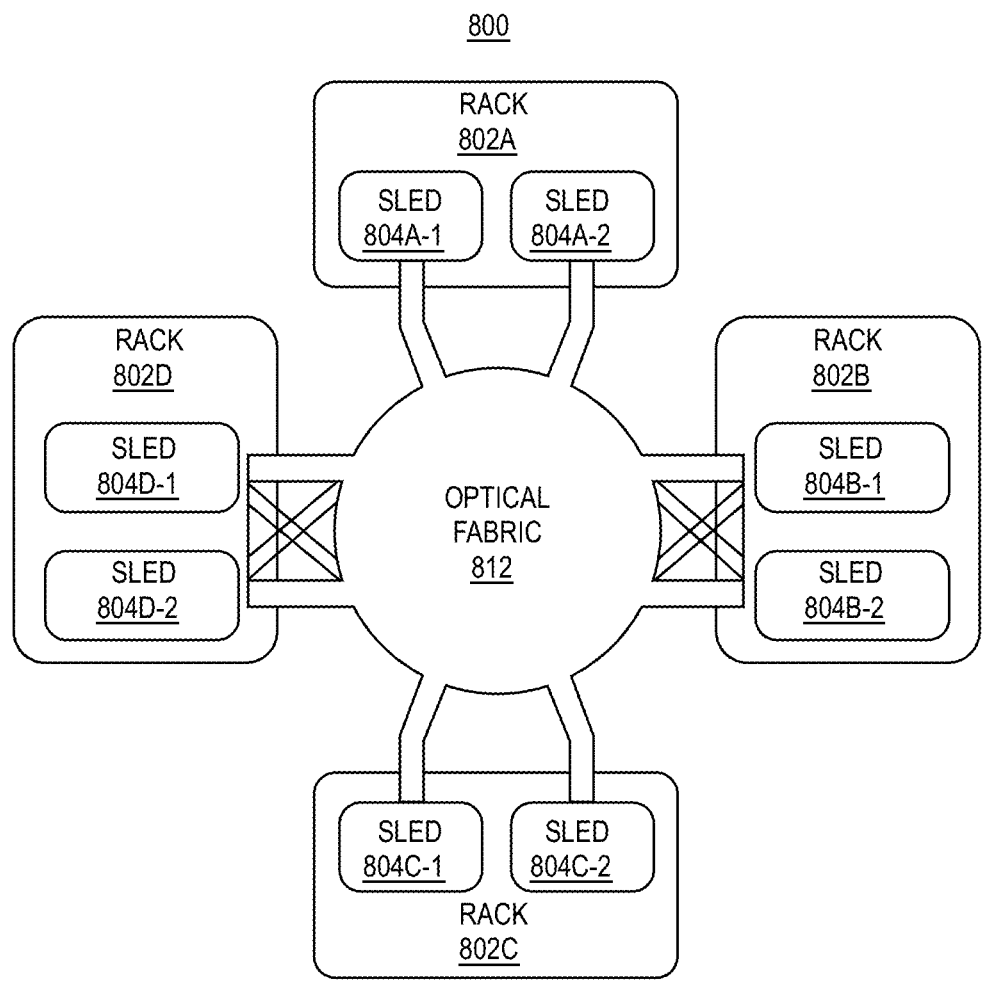
Figure 9:
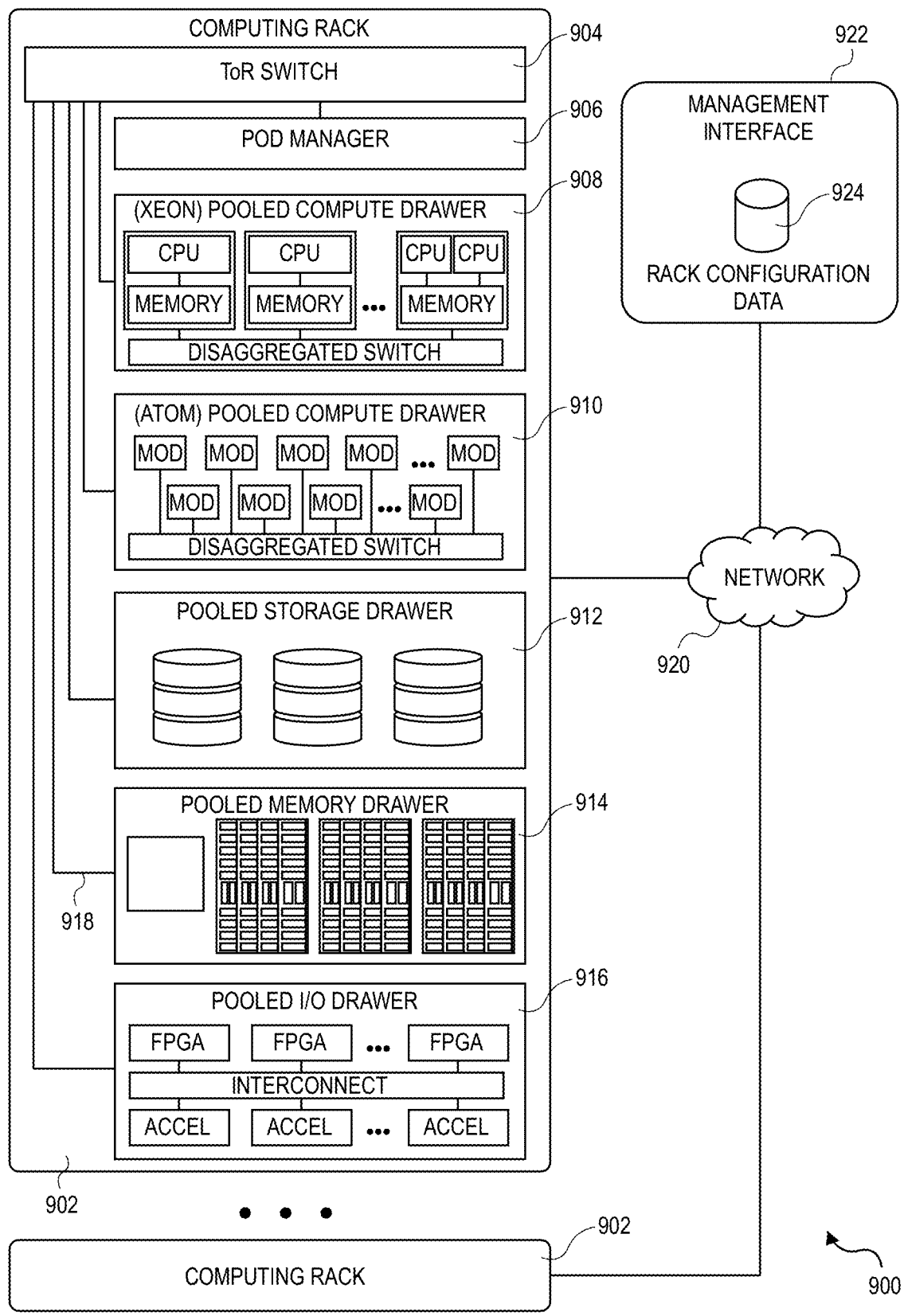

FIGS. 1a and 1b pertain to a prior art cooling assembly;
FIGS. 2a and 2b pertain to an improved cooling assembly;
FIGS. 3a, 3b, and 3c pertain to a bolster plate;
FIGS. 4a, 4b, 4c, and 4d pertain to a loading plate;
FIGS. 5a, 5b, 5c, and 5d pertain to a fixturing element;
FIG. 6 pertains to another fixturing element;
FIG. 7 pertains to a electronic system;
FIG. 8 pertains to a data center;
FIG. 9 pertains to a rack.

DETAILED DESCRIPTION

FIGS. 1a and 1b pertain to a prior art semiconductor chip cooling assembly. Referring to FIG. 1a, to form the assembly, a semiconductor chip package 112 is mounted within the window opening of a chip carrier 109. The chip carrier 109 (with attached chip package 112) is then mounted to the underside of the base of the heat sink 110. Notably, the base of the heat sink 110 has holes with spring loaded fixturing elements 111 that are aligned with load studs 107 that emanate from a bolster plate (a circuit board 101 with chip package socket 104 has a priori been rigidly secured between the bolster plate 103 and a back plate 102 with backing bolts ("back bolts") 105).

The heat sink 110 (with attached carrier 109 and chip package 112) is then lowered onto the bolster plate 103 with the load studs 107 being inserted into the spring loaded fixturing elements 111. The spring loading fixturing elements 111 are then tightened (a torsion bar is rotated) which secures the bolster plate 103 to the heat sink 110 (a spring loading force is created by the fixturing elements 111 that pulls the base of the heat sink 110 and the bolster plate 103 toward one another).

A problem with the prior art cooling assembly, referring to FIG. 1b, is the propensity of the heat sink 110 to move side-to-side and/or tilt 113 during the assembly process. Such movement and/or tilting 113 of the heat sink 110 can cause any of a number of problems such as I/O damage at the package/socket, socket/board and/or package/board interfaces (depending on which such interfaces are present), higher thermal resistance between the chip package and heat sink, and/or reliability problems because of uneven weight distribution around the bolster plate and through the load studs.

FIGS. 2a and 2b shows an improved cooling assembly that promotes vertical movement of the heat sink during its assembly but discourages lateral movement and/or tilting of the heat sink during its assembly. FIG. 2a shows an exploded view while FIG. 2b shows a cross section of the completed assembly.

In the improved cooling assembly, a circuit board 201 (e.g., a printed circuit board) is sandwiched between a bolster plate 203 and a back plate 202. Unlike the bolster plate of the prior art cooling assembly, however, the bolster plate 203 of the improved cooling assembly aligns the backing bolt 205 and the loading stud 207 along a single axis 208. In various embodiments, a backing bolt 205 and loading stud 207 pair that are aligned along the same axis 208 are formed from a single mechanical element that is positioned in the bolster plate 203 to have the backing bolt 203 emanate downward from the underside of the bolster plate 203 and the loading stud 207 emanate upward from the upper surface of the bolster plate 203.

Also, in the improved embodiment of FIGS. 2a and 2b, the chip package 212 is mounted to a thicker, load bearing "loading plate" 209 (rather than a thinner non-load bearing carrier 109 as in the prior art solution). The thicker loading plate 209 includes the spring loaded fixturing elements 211 for securing the heat sink to the bolster plate 203.

These and other improvements are described immediately below.

FIGS. 3a and 3b depict an embodiment of the bolster plate. As observed in FIG. 3a, a backing bolt 305 and loading stud 307 are aligned along a same vertical axis (which is different than the prior art approach in which the backing bolt 105 and load stud 107 are aligned along different respective axis 106, 108). Multiple such bolt/stud pairs can exist around the bolster plate 303. In the particular embodiment of FIGS. 3a and 3b there are six such pairs but other embodiments can use fewer (e.g., four pairs for less heavy heat sinks) or more (e.g., 8 pairs for heavier heat sinks).

The alignment of a backing bolt 305 and loading stud 307 pair along a same vertical axis causes the weight of the heat sink 210 to be more evenly shared by the backing plate 202 and bolster plate 303, and/or, be more uniformly distributed across the bolster plate 303 and/or backing plate 202 as compared to the prior art approach. FIG. 3b shows an embodiment of the bolster plate without the backing bolt and loading studs being installed.

Such uniformity is even further enhanced in embodiments where a backing bolt 305 and loading stud 307 pair are different sections of a same mechanical component 323 as observed in FIG. 3c (e.g., the single element 323 is milled from a same metal or metal alloy bulk material or molded from a same metal, metal alloy (e.g., steel), etc.). Here, referring to FIGS. 3a, 3b, and 3c, a support ring 314 that is formed in the single mechanical element 323 is welded or brazed on its bottom side to the top side of the bolster plate 303. After the attachment of the single element 323 to the bolster plate 303, the backing bolt section 305 of the element 323 protrudes downward from the bottom surface of the bolster plate 303 while the loading stud section 307 of the element 323 emanates upward from the top surface of the bolster plate 303.

Additional characteristics of the bolster plate 303 embodiment observed in FIGS. 3a and 3b is the presence of stamped protrusions 315 and the absence of any holes. Both of these features provide strengthening improvements over the bolster plate of the prior art cooling assembly. The strengthening improvements diminish the bolster plate's propensity to bend or flex, which, in turn, results in less propensity of the heat sink to tilt or move sideways during its installation.

In general, a metal sheet by itself is easily bent (a metal sheet by itself is flexible). The presence of stamped protrusions 315 upon the surface of a metal sheet, however, decreases the sheet's flexibility. Here, any particular stamped protrusion 315, having shorter length and width than the overall plate 303, requires an extremely large force to bend. The existence of multiple such protrusions along the surface of the plate 303 therefore reduces the flexibility of the plate 303 as a whole to something that is comparable to the flexibility of the individual protrusions themselves.

Moreover, as mentioned above with respect to the prior art cooling assembly, the prior art bolster plate includes numerous holes in which backing bolts, alignment pins, and/or loading studs are placed. The presence of such numerous holes corresponds to the absence of metal material which, in turn, creates a more elastic plate. As such, the prior art bolster plate is more easily bent resulting in heat sink tilt or lateral movement. By contrast, the improved bolster plate 303 of FIGS. 3a and 3b, other than the holes through which the single element backing bolt and loading stud elements 323 are inserted, does not include any holes. As such, the improved bolster plate 303 is less easily bent resulting in reduced heat sink tilt or lateral movement.

Referring back to FIGS. 2a and 2b, the improved assembly also includes a loading plate 209. According to a first assembly approach, the semiconductor chip package is mounted within the window of the loading plate 209. The loading plate 209 (with attached chip package 212) is then mounted to the underside of the base of the heat sink 210. The loading plate 209 (and chip package 212) with attached sink 210 is then mounted to the bolster plate 203.

According to a second assembly approach, the semiconductor chip package 212 is mounted within the window of the loading plate 209. The loading plate 209 (with attached chip package 212) is then mounted to the bolster plate 203. The heat sink 210 is then mounted to the loading plate 209.

Note that in both of the above described assembly processes the loading plate 209 (with attached chip packaged 212) is mounted to the bolster plate 209, and, the heat sink 210 is mounted to the loading plate 209. This stands in contrast to the prior art approach in which the heat sink 110, having spring loaded fixturing elements 111, is mounted to the bolster plate 103.

Here, the prior art approach uses a thin metallic "carrier" 109 whose sole mechanical purpose is to hold the chip package 112 in the underside of the base of the heat sink 110. The weight of the heat sink 110 is therefore borne by directly the bolster plate 103 via its direct mechanical connection with the heat sink 110.

By contrast, in the improved approach, as observed in FIGS. 2a and 2b, the "carrier" 109 is thickened to a "loading plate" 209 so that it can bear the weight of the heat sink 210 (unlike the carrier 109 in the prior art assembly). For example, in the prior art approach the carrier 109 is no more than 2.5 mm thick. By contrast, the thickened loading plate 209 has a thickness greater than 2.5 mm thick (e.g., in a range from 2.5 mm to 3.0 mm).

In essence, whereas a traditional carrier 109 by itself cannot support the weight of a heat sink by (by itself, a carrier would substantially bend under the weight of a heat sink), by contrast, the loading plate 209 by itself can support the weight of a heat sink (by itself, a loading plate does not substantially bend under the weight of a heat sink). The thicker loading plate 209 also has mechanically integrated fixturing elements 211 to mount the loading plate 209 to the bolster plate 203.

As such, in various embodiments, in the completed assembly, the heat sink 210 essentially "sits on" the loading plate 209 rather than being spring load mounted to the bolster plate 203 (as in the prior art approach). As such, the weight of the heat sink 210 is borne by the loading plate 209, the bolster plate 203, and the back plate 202 through the common axis 208 of the backing bolt 205 and load stud 207 (this particular weight bearing design is further enhanced with a common backing bolt 305 and load stud 307 element 323 that is secured to the back plate 202 at one end and the loading plate 209 at the other end). The loading plate 209 also performs a traditional carrier function in that the chip package 212 is mounted within the window of the loading plate 209.

Figure 4A:
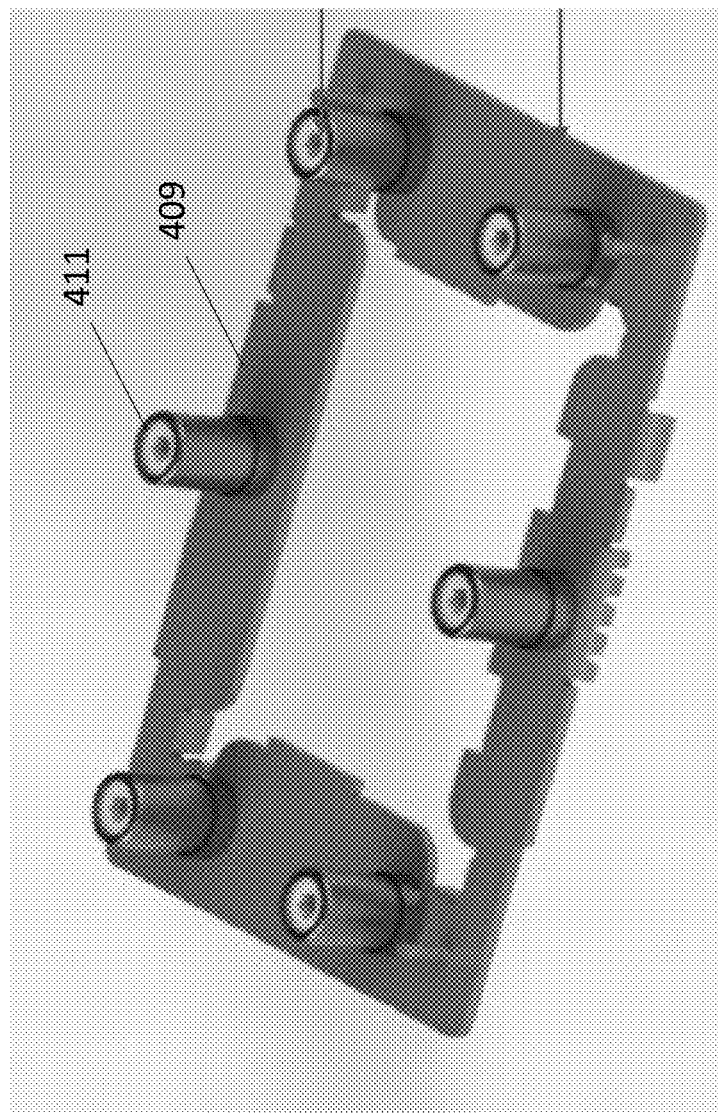
Figure 4B:
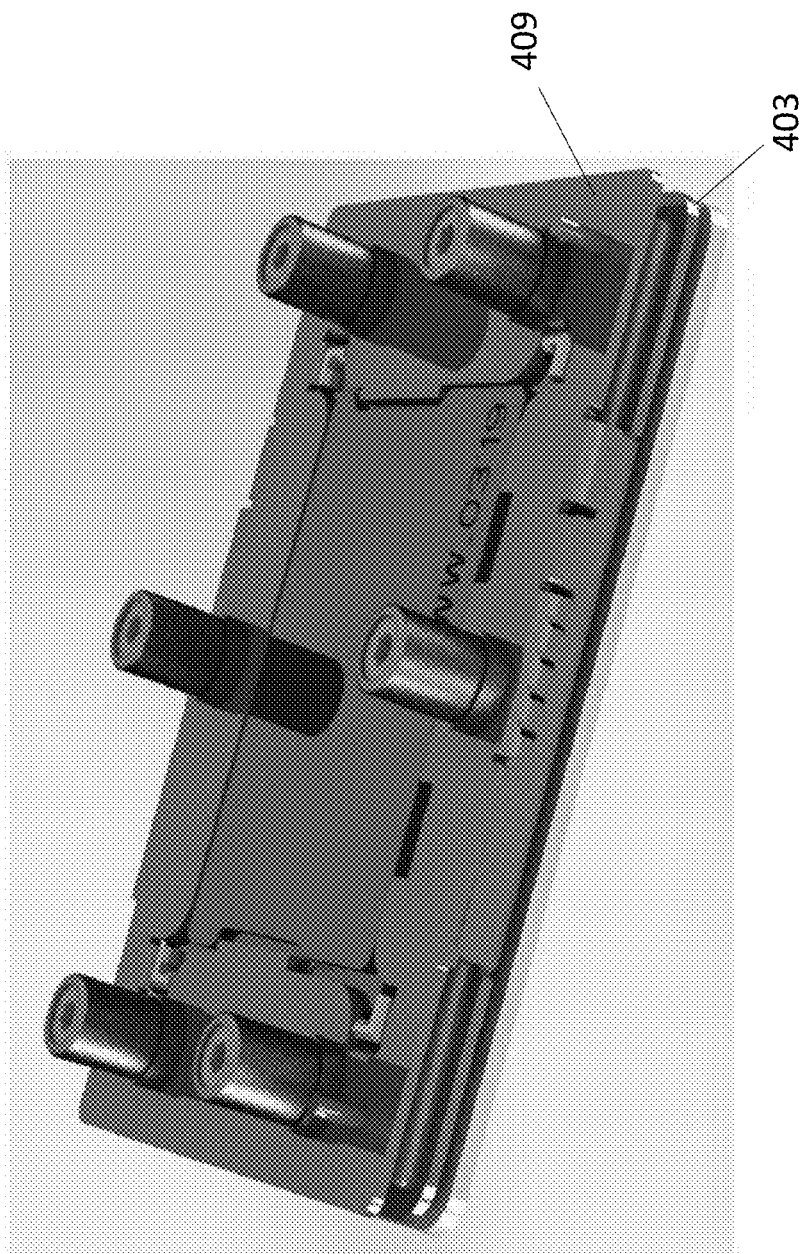

FIGS. 4a, 4b, and 4c show more detailed views of the loading plate 409. FIG. 4a shows an isolated loading plate 409 with mechanically integrated fixturing elements 411. FIG. 4b shows an isolated view of a loading plate 409 mounted to the bolster plate 403. FIG. 4c shows the structure of FIG. 4b with a heat sink 410 mounted on the loading plate 409. In FIG. 4c, note that the heat sink has holes 416 in which the loading plate's fixturing elements 411 are inserted.

The loading plate 409, ideally, evenly distributes the weight of the heat sink 410 around the loading plate's frame arms. Because the weight of the heat sink 410 is substantially evenly distributed around the frame arms of the loading plate 409, the weight of the heat sink 410 is substantially evenly distributed through the loading studs and around the bolster plate 403 and back plate, which, in turn, diminishes tilting of the heat sink. Said another way, the loading plate 409 in combination with the common axis of the load studs and back bolts causes the weight of the heat sink 410 to be more evenly distributed at the bolster plate 403 and back plate 402 than was possible with the prior art approach. Even distribution of the weight, in turn, translates into little/no tilt and/or lateral movement of the heat sink during its installation.

Additionally, with three thick plates (loading, bolster, and back plates) supporting the weight of the heat sink 410 rather than two thick plates as in the prior art solution (bolster plate and back plate), there is less propensity of any of the plates to bend under the weight of the heat sink which further limits the tilt and/or lateral movement of the heat sink during its installation.

In further embodiments, as observed in FIG. 4d, the loading plate 409 and bolster plate 403 have respective mechanical keys 417 that prevent mis-orientation of the loading plate 409 with the bolster plate 403 when the two are secured together. Here, a specific arrangement of teeth formed on the loading plate 409 are designed to fit into a corresponding arrangement of grooves formed in the bolster plate 403 (and/or vice-versa). The teeth/groove arrangement is such that the loading plate 409 cannot be pressed flush against the bolster plate 403 unless the teeth are properly aligned with their corresponding grooves.

As mentioned above the loading plate 209, 409 has integrated fixturing elements 211, 411 for securing the loading plate 409 to the bolster plate 403.

FIGS. 5a through 5d pertain to an embodiment of the fixturing elements 211, 511 that mount to the single element 323 back bolt and loading stud discussed above with respect to FIG. 3c. As described in more detail immediately below, the single bolt/stud element 323 also includes a spring section 313 to induce spring loading between the loading plate 307 and the bolster plate 303 when the fixturing elements 211, 511 are secured to the loading stud 307 section of the single element 323.

Figure 5A:
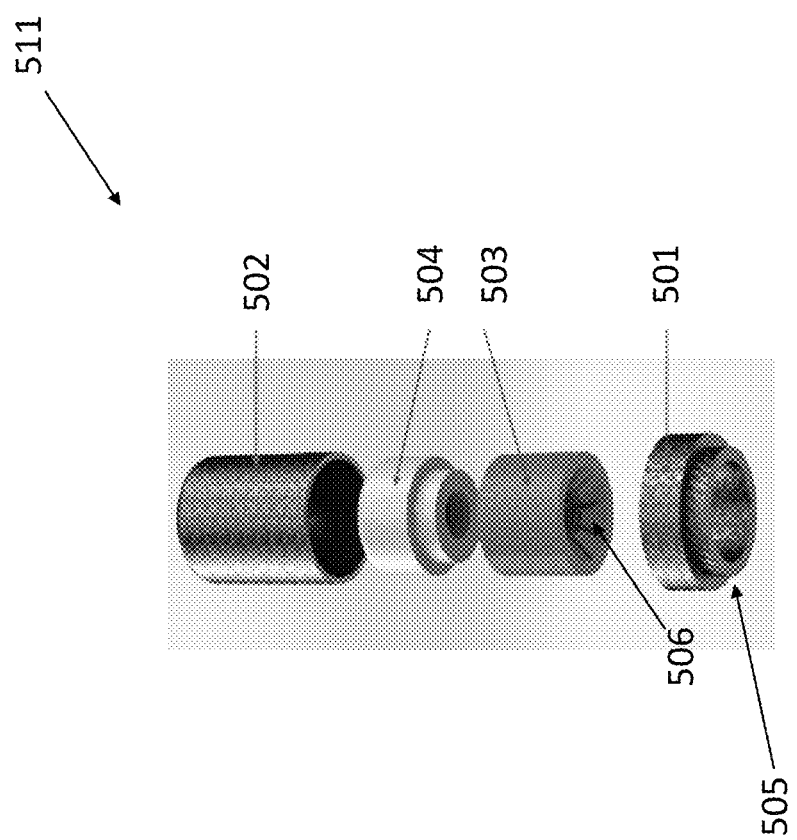

FIG. 5a depicts an exploded view of an embodiment of the fixturing element hardware 511. As observed in FIG. 5a, the fixturing element hardware 511 includes a top nut 504 and bottom nut 503 that are encased within a housing. The housing is formed by a top part 502 and a bottom part 501. In the particular embodiment of FIG. 5a, the inner radius of the opening in the top of the bottom housing part 501 is approximately the same as the outer radius of the opening in the bottom of the top housing part 502 such that the top housing part 502 press fits into the bottom housing the part 501. The bottom housing part 501 has features 505 on its underside that allows it to press fit into corresponding holes in the bolster plate.

To assemble the fixturing element 511 onto the loading plate, the bottom housing part 501 is press fit into a corresponding opening in the bolster plate. The bottom nut 503 is placed in a top opening in the bottom housing 501 and the top nut 504 is placed on the bottom nut 503. The top housing 502 is then placed over the stacked bottom and top nuts 503, 504 and press fit into the bottom housing 501.

When the fixturing element 511 has been assembled on the loading plate, the loading plate is ready to be attached to the bolster plate. As described above, such attachment can occur with or without the heat sink being attached to the loading plate (attachment of the chip package within the window opening of the loading plate is assumed).

According to one embodiment, a loading plate with chip package and fixturing elements and a heat sink that is mounted to the loading plate are shipped as a unit to system manufacturers. The system manufacturers design circuit boards having the corresponding bolster plate (and back plate) for the particular loading plate component of the shipped unit.

As such, after a system manufacturer receives the assembled loading plate and heat sink unit, the system manufacturer merely places the received unit on the loading studs that emanate from the bolster plate. Here, the aforementioned holes in the loading plate that the respective bottom housing parts 501 (of the fixturing elements that are integrated with the loading plate) are press fit into receive the load studs. The bottom and top nuts 503, 504 then secure the fixturing elements 511 to the load studs.

As such, to mount the loading plate and heat sink unit to the bolster plate, a technician merely has to align the fixturing elements 211, 411, 511 on the loading plate with their corresponding load studs 207, 407 and lower the unit onto the bolster plate such that load studs are inserted into the aforementioned holes in the loading plate and engage with the bottom nut 503 of the respective fixturing elements 211, 411, 511.

Importantly, apart from the simple mounting procedure described just above, the bottom and top nuts 503, 504 of the fixturing elements 211, 411, 511 are designed to diminish or eliminate tilting of the bolster plate 209, 409 as the bolster plate 209, 409 is secured to the bolster plate 203, 303. With an un-tilted bolster plate, the heat sink is likewise un-tilted when the cooling assembly is finally completed.

Figure 5B:
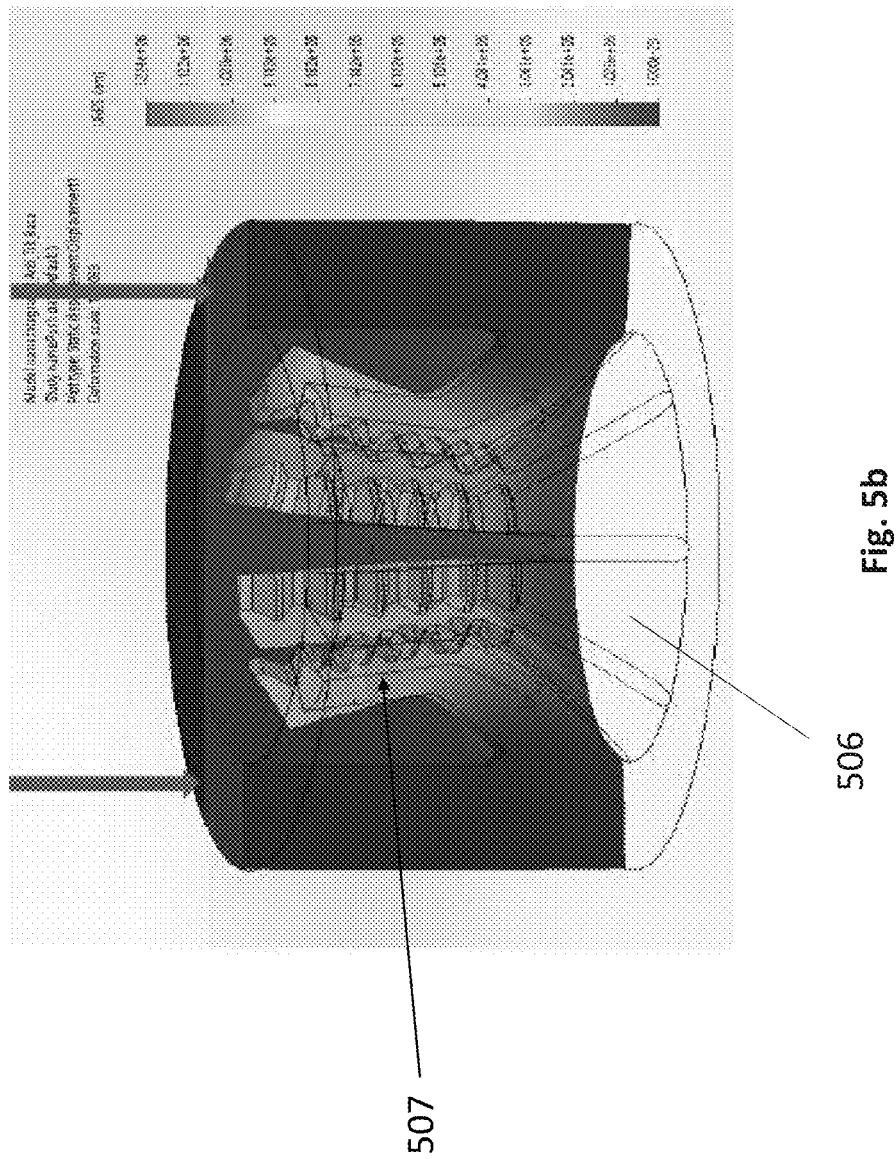
Figure 5C:
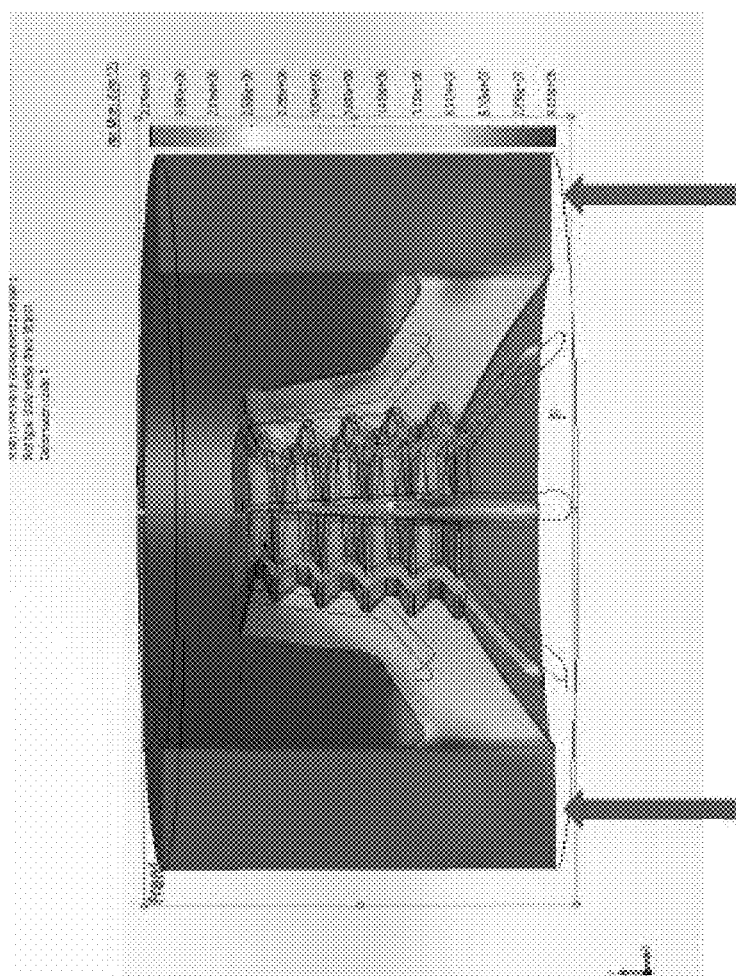

FIGS. 5b and 5c show two different states of the bottom nut 503 as a load stud is engaged with the load nut's fixturing element. FIG. 5b shows the state of the bottom nut 503 when the load stud is first inserted into the opening at the bottom of the bottom nut 503. Notably, the opening at the bottom of the bottom nut is formed as conically shaped tabs or fingers 506 that point deeper into the nut (also observed in FIG. 5a). The wider opening at the bottom of the bottom nut 503 allows the very bottom of the bottom nut 503 to "capture" the load stud when the loading plate is initially aligned with and placed upon the loading studs.

The regions 507 of the tabs/fingers 506 that are closer to the top of the bottom nut 503 are threaded and act as alignment locks that ideally prevent the loading plate from tilting as the load studs are threaded deeper into the fixturing.

Specifically, as the load stud enters the bottom nut 503 it eventually reaches and threads into the top nut 504. The top of the top housing 502 is open and exposes the upper surface of the top nut 504 which provides an interface for a hex key or other kind of wrench. As the technician rotates the top nut 504, the load stud threads deeper into the top nut 504 (the load stud is pulled upward into the top nut 504 by the rotation of the top nut 504).

Importantly, the pulling of the load stud continually upward into the top nut 504 bends the threaded regions 507 of the tabs 506 in the bottom nut 503 away from the stud as observed in FIG. 5b (the tabs 506 are finger-like and therefore have some elasticity). Thus, so long as the loading plate has little/no tilt, the technician will experience the resistance associated with the rotation of the top nut 504 as the load stud is pulled upward into the top nut 504.

If, however, the loading plate attempts to tilt during attachment of the fixturing elements to their corresponding load studs, the load studs that are nearest the regions of the loading plate that are attempting to rise higher than other regions of the loading plate will try to "pull away" or "pull out" from their corresponding top nut. In response to the pulling-away action of the load studs in the regions of the loading plate that are attempting to rise higher than other regions of the loading plate, the tabs of the corresponding bottom nuts 503 will "lock" on these load studs as observed in FIG. 5c and FIG. 5d. The clamping down of the tabs on the load studs that are attempting to pull away from their top nuts essentially prevents the pulling away action which, in turn, (ideally) prevents the loading plate 509 from tilting.

As mentioned above, the fixturing elements are part of an overall spring loaded attachment mechanism that uses the load stud as the spring element. More specifically, referring to FIG. 3c, the spring loading is effected by the middle section 313 of the single integrated back bolt and load stud element 323 of FIG. 3c.

More specifically, middle section 313 has metal material deliberately removed. The removal of the metal material reduces the metal mass in the middle region 313 thereby giving the middle region 313 some elasticity (the more metal material that is removed, the more elastic the middle region 313 becomes).

As the load stud is threaded deeper into the top nut of the attachment hardware, the spring element 313 is increasingly/pulled stretched. When the loading plate is fully secured to the bolster plate because the load stud has been pulled its final distance into the top nut, the middle/spring section 313 of the integrated load/back stud is stretched so that it exerts a force that pulls the loading plate and bolster plate toward one another which corresponds to the spring loading of the attachment mechanism.

In various embodiments, referring back to FIGS. 5a and 5d, the bottom nut 503 also has an associated height that corresponds to a "stop" on the amount that the top nut 504 can be turned. In various embodiments, the height of the bottom nut 503 is the same across all of the fixturing elements 211, 411, 511 that are spaced around the loading plate 209, 409. As such, the respective top nuts 504 of all of the fixturing elements on the loading plate can only be turned a substantially similar (e.g., same) amount of rotations, which, in turn, diminishes or otherwise prevents tilt of the loading plate (e.g., all instances of loading attachment hardware are tightened equally with no instance of loading attachment hardware pulling its load stud further into its top nut than any other instance of loading attachment hardware).

Referring back to FIGS. 2a and 2b, recall that the heat sink 210 is mounted to the loading plate with a cam fixturing element 213. As observed in FIG. 2a, the cam fixturing elements 213 are centered on alignment pins 214 that emanate from the top surface of the loading plate 209 (there are four cam fixturing elements in the embodiment of FIG. 2a). To mount the heat sink 210 to the loading plate 207, the alignment pins 214 are aligned with their corresponding cam fixturing elements 213 and the heat sink 210 is lowered onto the loading plate 209 such that the alignment pins 214 are inserted into and engage with their corresponding cam fixturing element 213. In an embodiment, to engage with the cam fixturing element, the corresponding alignment pin have a pair of circular ribs that a finger within the cam fixturing element press fits in between.

After the heat sink 210 is seated on the loading plate 209 with the alignment pins 214 being engaged with their cam fixturing elements 213, referring to FIG. 6, a rotating flag 601 of the cam fixturing element 613 is rotated with causes the aforementioned finger 602 to ride up a cam groove 603 until it becomes latched into a notch 604. The raising of the finger pulls the alignment pin further upward into the cam fixturing element thereby further pressing the heat sink and loading plate against one another. In various embodiments the cam fixturing element is spring loaded (e.g., a spring is coupled between the finger and the base of cam fixturing element). Notably, however, the spring loading need not have the same force as the spring loading between the loading plate and the bolster plate.

Ideally, the pressing of the heat sink and loading plate against one another causes the bottom of the heat sink to press against thermal interface material (e.g., a thermally conductive paste that has been spread) on the top surface of the semiconductor chip package. The seal between the thermal interface material is easily broken (e.g., if a technician desires to remove the heat sink from the assembly) by rotating the cam's flag 601 back to an unlocked position.

It is noteworthy that numerous improvements have been described above in relation to a single embodiment (vertically aligned backing bolts and load stud, thicker loading plate, spring loaded fixturing elements mounted to loading plate, etc.). As such, there can exist other embodiments that include one or more of these improvements but do not include all of these improvements.

Although embodiments above have emphasized the presence of a heat sink in the cooling assembly it is conceivable that other kinds of cooling masses such as a cold plate or vapor chamber can be placed on the loading plate as described above. As such, the teachings above apply to cooling masses generally rather than only to heat sinks, specifically.

The following discussion concerning FIGS. 7, 8, and 9 are directed to systems, data centers and rack implementations, generally. FIG. 7 generally describes possible features of an electronic system that can include one or more semiconductor chip packages having a cooling assembly that is designed according to the teachings above. FIG. 8 describes possible features of a data center that can include such electronic systems. FIG. 9 describes possible features of a rack having one or more such electronic systems installed into it.

FIG. 7 depicts an example system. System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 700 includes interface 712 coupled to processor 710, which can represent a higher speed interface or a high throughput interface for system components that needs higher bandwidth connections, such as memory subsystem 720 or graphics interface components 740, or accelerators 742. Interface 712 represents an interface circuit, which can be a standalone component or integrated onto a processor die. Where present, graphics interface 740 interfaces to graphics components for providing a visual display to a user of system 700. In one example, graphics interface 740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 740 generates a display based on data stored in memory 730 or based on operations executed by processor 710 or both. In one example, graphics interface 740 generates a display based on data stored in memory 730 or based on operations executed by processor 710 or both.

Accelerators 742 can be a fixed function offload engine that can be accessed or used by a processor 710. For example, an accelerator among accelerators 742 can provide compression (DC) capability, cryptography services such as public key encryption (PKE), cipher, hash/authentication capabilities, decryption, or other capabilities or services. In some embodiments, in addition or alternatively, an accelerator among accelerators 742 provides field select controller capabilities as described herein. In some cases, accelerators 742 can be integrated into a CPU socket (e.g., a connector to a motherboard or circuit board that includes a CPU and provides an electrical interface with the CPU).

For example, accelerators 742 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 742 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

The system can also include an infrastructure processing unit (IPU) or data processing unit (DPU) to process the requests received by the system and dispatch them to an appropriate processor or accelerator within the system.

Memory subsystem 720 represents the main memory of system 700 and provides storage for code to be executed by processor 710, or data values to be used in executing a routine. Memory subsystem 720 can include one or more memory devices 730 such as read-only memory (ROM), flash memory, volatile memory, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software functionality to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

The memory resources can also be tiered (different access times are attributed to different regions of memory), disaggregated (memory is a separate (e.g., rack pluggable) unit that is accessible to separate (e.g., rack pluggable) CPU units), and/or remote (e.g., memory is accessible over a network).

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 700 includes interface 714, which can be coupled to interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can transmit data to a remote device, which can include sending data stored in memory. Network interface 750 can receive data from a remote device, which can include storing received data into memory. Various embodiments can be used in connection with network interface 750, processor 710, and memory subsystem 720.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data in a persistent state (e.g., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (e.g., the value or state of the data is indeterminate if power is interrupted to system 700). In one example, storage subsystem 780 includes controller 782 to interface with storage 784. In one example controller 782 is a physical part of interface 714 or processor 710 or can include circuits in both processor 710 and interface 714.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 700. More specifically, power source typically interfaces to one or multiple power supplies in system 700 to provide power to the components of system 700. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 700 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 7, other types of systems to which the above described invention can be applied and are also partially or wholly described by FIG. 7 are communication systems such as routers, switches, and base stations.

FIG. 8 depicts an example of a data center. Various embodiments can be used in or with the data center of FIG. 8. As shown in FIG. 8, data center 800 may include an optical fabric 812. Optical fabric 812 may generally include a combination of optical signaling media (such as optical cabling) and optical switching infrastructure via which any particular sled in data center 800 can send signals to (and receive signals from) the other sleds in data center 800. However, optical, wireless, and/or electrical signals can be transmitted using fabric 812. The signaling connectivity that optical fabric 812 provides to any given sled may include connectivity both to other sleds in a same rack and sleds in other racks.

Data center 800 includes four racks 802A to 802D and racks 802A to 802D house respective pairs of sleds 804A-1 and 804A-2, 804B-1 and 804B-2, 804C-1 and 804C-2, and 804D-1 and 804D-2. Thus, in this example, data center 800 includes a total of eight sleds. Optical fabric 812 can provide sled signaling connectivity with one or more of the seven other sleds. For example, via optical fabric 812, sled 804A-1 in rack 802A may possess signaling connectivity with sled 804A-2 in rack 802A, as well as the six other sleds 804B-1, 804B-2, 804C-1, 804C-2, 804D-1, and 804D-2 that are distributed among the other racks 802B, 802C, and 802D of data center 800. The embodiments are not limited to this example. For example, fabric 812 can provide optical and/or electrical signaling.

FIG. 9 depicts an environment 900 that includes multiple computing racks 902, each including a Top of Rack (ToR) switch 904, a pod manager 906, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 908, and INTEL® ATOM™ pooled compute drawer 910, a pooled storage drawer 912, a pooled memory drawer 914, and a pooled I/O drawer 916. Each of the pooled system drawers is connected to ToR switch 904 via a high-speed link 918, such as a 40 Gigabit/second (Gb/s) or 100 Gb/s Ethernet link or an 100+ Gb/s Silicon Photonics (SiPh) optical link. In one embodiment high-speed link 918 comprises an 1000 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 900 may be interconnected via their ToR switches 904 (e.g., to a pod-level switch or data center switch), as illustrated by connections to a network 920. In some embodiments, groups of computing racks 902 are managed as separate pods via pod manager(s) 906. In one embodiment, a single pod manager is used to manage all of the racks in the pod. Alternatively, distributed pod managers may be used for pod management operations. RSD environment 900 further includes a management interface 922 that is used to manage various aspects of the RSD environment. This includes managing rack configuration, with corresponding parameters stored as rack configuration data 924.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software, and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after"

can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z".

The invention claimed is:

1. An apparatus, comprising:
a bolster plate having a window;
a load stud that emanates from a face of the bolster plate;
a back bolt that emanates from an opposite face of the bolster plate, the back bolt to secure the bolster plate to a back plate with a circuit board therebetween, the circuit board to support a semiconductor chip package within the window, the load stud and the back bolt oriented along a same axis that is orthogonal to the face and the opposite face; and
a fixturing element to secure a loading plate to the bolster plate, the fixturing element including fingers that: (a) open away from the load stud when the load stud moves in a first direction that is deeper into the fixturing element and (b) clamp upon the load stud when the load stud moves in an opposite direction.

2. The apparatus of claim 1 wherein the load stud and the back bolt are different sections of a same mechanical element.

3. The apparatus of claim 2 further including the loading plate, the loading plate to be placed on the bolster plate, the loading plate having a thickness to support weight of a heat sink that is to be thermally coupled to the semiconductor chip package.

4. The apparatus of claim 3 wherein a load spring for the fixturing element is formed by the mechanical element between the load stud and the back bolt.

5. The apparatus of claim 1 further including the loading plate, the loading plate to be placed on the bolster plate, the loading plate having a thickness to support weight of a heat sink that is to be thermally coupled to the semiconductor chip package.

6. The apparatus of claim 1 wherein the bolster plate does not include any observable holes.

7. The apparatus of claim 1 wherein the bolster plate includes protrusions to strengthen the bolster plate.

8. An apparatus, comprising:
a heat sink;
a loading plate, the heat sink mounted to the loading plate, the loading plate to be placed on a bolster plate, the loading plate including a fixturing element to secure the loading plate to the bolster plate, the loading plate having a thickness to support weight of the heat sink, the fixturing element including fingers that: (a) open away from a load stud of the bolster plate when the load stud moves in a first direction that is deeper into the fixturing element and (b) clamp upon the load stud when the load stud moves in an opposite direction; and
a semiconductor chip package mounted to the loading plate, the semiconductor chip package being thermally coupled to the heat sink.

9. The apparatus of claim 8 wherein the fingers are threaded.

10. The apparatus of claim 8 wherein the loading plate includes multiple fixturing elements to secure the loading plate to the bolster plate, the multiple fixturing elements including a respective nut to thread onto a respective load stud of the bolster plate, the fixturing elements including a respective stop element to stop further threading of the respective nut onto the respective load stud.

11. The apparatus of claim 8 wherein the loading plate has keys to mate with corresponding keys and/or grooves on the bolster plate.

12. The apparatus of claim 8 wherein the heat sink is mounted to the loading plate with a second fixturing element in a locked state, the thermal coupling between the heat sink and the semiconductor chip package to break when the second fixturing element is unlocked.

13. The apparatus of claim 12 wherein the second fixturing element includes a cam to drive a pin that emanates from the loading plate toward the heat sink when the second fixturing element is being locked.

14. An apparatus, comprising:
a back plate;
a bolster plate that is secured to the back plate with a back bolt, the bolster plate having a window;
a circuit board between the back plate and the bolster plate, a semiconductor chip package electro-mechanically coupled to the circuit board within the window;
a load stud that emanates from a face of the bolster plate, the back bolt emanating from an opposite face of the bolster plate, the load stud and the back bolt oriented along a same axis that is orthogonal to the face and the opposite face;
a heat sink; and
a loading plate, the heat sink mounted to the loading plate, the loading plate including a fixturing element that is secured to the load stud to secure the loading plate to the bolster plate, the fixturing element including fingers that: (a) open away from the load stud when the load stud moves in a first direction that is deeper into the fixturing element and (b) clamp upon the load stud when the load stud moves in an opposite direction.

15. The apparatus of claim 14 wherein the load stud and the back bolt are different sections of a same mechanical element.

16. The apparatus of claim 15 wherein a load spring for the fixturing element is formed by the mechanical element between the load stud and the back bolt.

17. The apparatus of claim 14 wherein the bolster plate does not include any observable holes.

18. The apparatus of claim 14 wherein the bolster plate includes protrusions to strengthen the bolster plate.

* * * * *